US006958613B2

(12) United States Patent
Braun et al.

(10) Patent No.: US 6,958,613 B2
(45) Date of Patent: Oct. 25, 2005

(54) METHOD FOR CALIBRATING SEMICONDUCTOR DEVICES USING A COMMON CALIBRATION REFERENCE AND A CALIBRATION CIRCUIT

(75) Inventors: Georg Braun, Holzkirchen (DE); Hermann Ruckerbauer, Moos (DE); Simon Muff, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/675,492

(22) Filed: Sep. 30, 2003

(65) Prior Publication Data

US 2004/0080322 A1 Apr. 29, 2004

(30) Foreign Application Priority Data

Sep. 30, 2002 (DE) ................................ 102 45 536

(51) Int. Cl.[7] ............................................. G01R 35/00
(52) U.S. Cl. .................... 324/601; 324/158.1
(58) Field of Search ................................ 324/763, 537, 324/130, 601, 73.1, 765, 158.1; 702/85, 89, 702/107, 117, 118; 254/48

(56) References Cited

U.S. PATENT DOCUMENTS

| 4,559,521 | A | * | 12/1985 | Yada ........................ 341/168 |
| 6,281,818 | B1 | | 8/2001 | Miller ....................... 341/120 |
| 6,330,194 | B1 | | 12/2001 | Thomann et al. ...... 365/189.05 |
| 6,330,517 | B1 | * | 12/2001 | Dobrowski et al. ......... 702/104 |
| 6,442,102 | B1 | * | 8/2002 | Borkenhagen et al. ...... 365/233 |
| 6,631,338 | B2 | * | 10/2003 | To et al. ..................... 702/107 |
| 6,807,650 | B2 | * | 10/2004 | Lamb et al. .................... 716/1 |
| 2002/0018537 | A1 | | 2/2002 | Zielbauer et al. ........ 324/158.1 |
| 2002/0135357 | A1 | | 9/2002 | Maassen et al. ............ 375/377 |
| 2004/0201416 | A1 | * | 10/2004 | Wyers et al. .................. 330/2 |

FOREIGN PATENT DOCUMENTS

DE  100 37 477 A1  2/2002

\* cited by examiner

Primary Examiner—Paresh Patel
(74) Attorney, Agent, or Firm—Laurence A. Greenberg; Werner H. Stemer; Ralph E. Locher

(57) ABSTRACT

Interface parameters for a plurality of semiconductor devices, particularly parameters for output drivers (i.e. on chip driver) and terminations (i.e. on die termination) for double data rate dynamic random access memories, are aligned using a calibration reference which is common to the semiconductor devices and is connected to calibration connections on the semiconductor devices. The semiconductor devices are calibrated in succession, in each case individually, and the calibration connection on the respective semiconductor device which is currently performing calibration is connected to an internal calibration unit by an internal switching unit in the process, and the calibration connections on all other semiconductor devices are terminated to a high impedance internally.

14 Claims, 3 Drawing Sheets

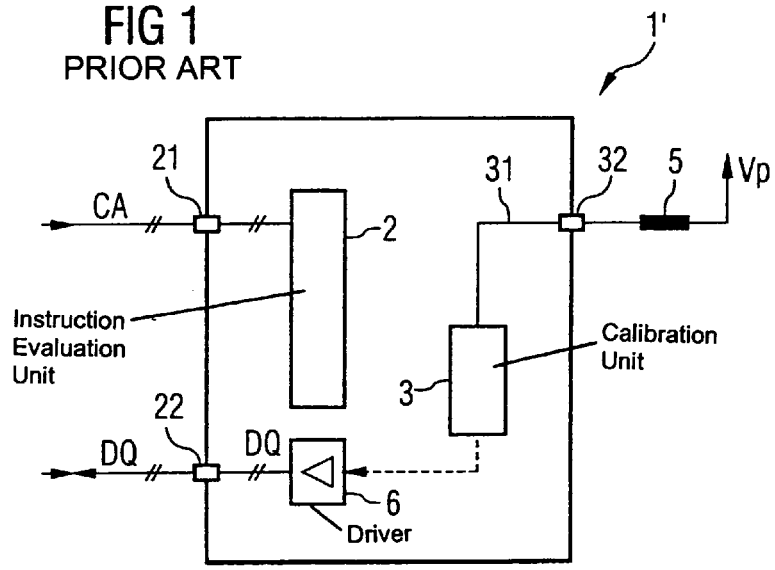
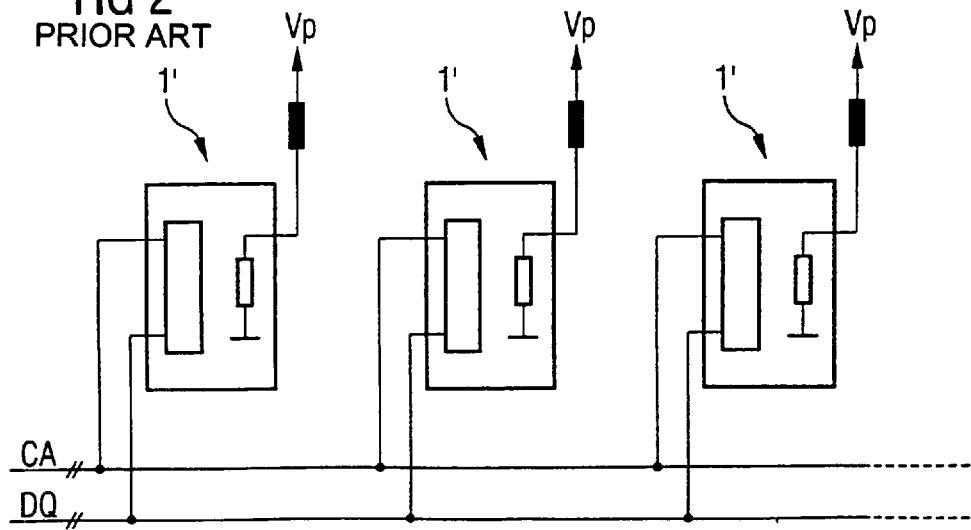

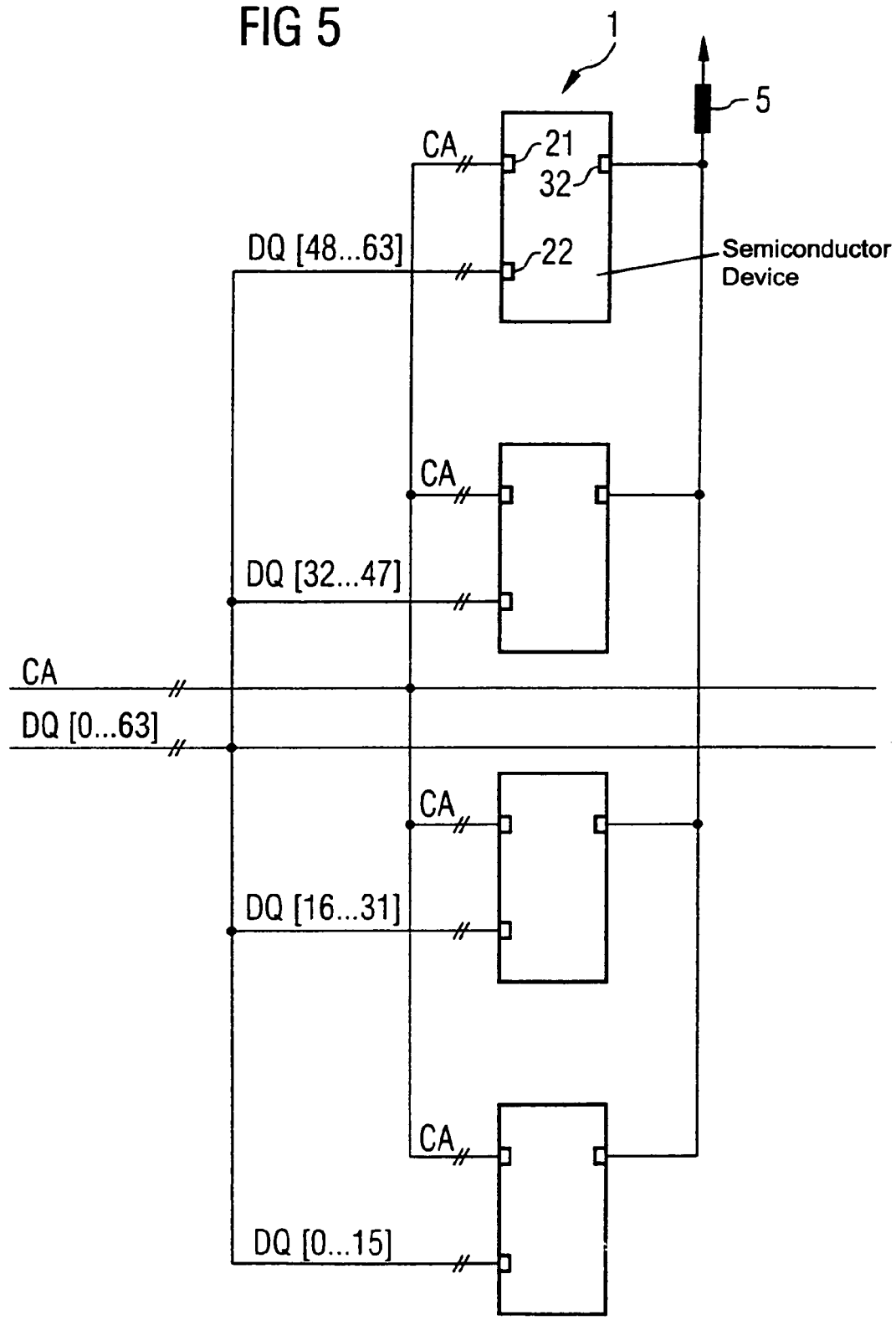

METHOD FOR CALIBRATING SEMICONDUCTOR DEVICES USING A COMMON CALIBRATION REFERENCE AND A CALIBRATION CIRCUIT

BACKGROUND OF THE INVENTION

FIELD OF THE INVENTION

The invention relates to the calibration of interface devices of semiconductor devices using a calibration reference.

In data bus systems, data lines combined to form a common data bus are used to transmit data signals between a plurality of semiconductor devices. As data transmission rates increase on the data bus, the semiconductor devices effecting access for the purpose of writing to the data bus or reading from the data bus demand narrower tolerances for the interface parameters in order to maintain the integrity of the data signals transmitted to the data bus. A first such interface parameter is the impedance of output drivers (i.e. off chip drivers (OCDs)), which a semiconductor device uses to output data signals to data signal lines in the data bus. Another interface parameter is formed by terminations, which terminate the data bus locally in the semiconductor device in order to prevent reflection (i.e. on chip termination (OCT)).

The interface parameters are subject to production variations and vary both from semiconductor device to semiconductor device and within a semiconductor device from output driver to output driver. In addition, the interface parameters are dependent on installation conditions for the semiconductor device and need to be matched to a configuration of the data bus system. The interface parameters are also subject to variations over time during operation of the semiconductor device. In this case, the variations over time result, by way of example, from any temperature dependency of the interface parameters or a dependency on an operating voltage for the semiconductor device.

For operation in data bus systems with a high data transmission rate, the interface parameters of the semiconductor device are therefore compared with a nominal value by a calibration unit implemented in the semiconductor device at least once before or during startup of the semiconductor device or repeatedly during operation of the semiconductor device and are realigned if required. In this context, a nominal value is ascertained using a calibration reference. For the alignment, both analog and digital methods using state machines and amplifier circuits are known.

For dynamic random access memories (DRAMs) based on a double data rate (DDR) standard, the output drivers can be aligned conventionally by impressing a calibration current via the output driver connections, measuring the voltage drop produced by the calibration current across the output drivers, and comparing the measured voltage drop with a nominal value for the voltage drop. For the alignment, the value of a control element for the output driver is set using an entry in a mode register in the DRAM. Such alignment of the output drivers is normally carried out before starting up the semiconductor device in a data bus system in a test laboratory. Matching to specific installation parameters is then not possible.

The calibration reference is provided, by way of example, as a voltage reference or calibration resistor either within the semiconductor device or outside the semiconductor device. If the calibration reference is disposed inside the semiconductor device, then a particular drawback is the circumstance that a value for the calibration reference actually need to be stipulated at the time at which the semiconductor device is produced. On the other hand, however, it is thus possible to match the interface parameters in terms of a configuration of the data bus system only if the semiconductor device is produced in various series using respectively different values for the calibration reference.

By contrast, an external calibration reference connected to a calibration connection on the semiconductor device allows late stipulation of the value of the calibration reference in a manner matched to the respective data bus system. In addition, the accuracy and, by way of example, further compensation circuits for stabilizing the calibration reference, and also subsequently the system costs, can advantageously be matched to the demands on the data bus system.

A DDR-DRAM generally has output drivers that can be calibrated using an external calibration reference. To make matters simpler, the discussion in this case has been reduced to those components of the DDR-DRAM that are fundamental in this context. The DDR-DRAM has control and address connections for connecting a control and address bus, data connections for connecting a data bus formed by data lines and a calibration connection. The calibration reference is connected to the calibration connection. A calibration unit connected to the calibration connection via a calibration path uses the calibration reference to align the output drivers.

A plurality of the DDR-DRAM described above can be disposed to form a data bus system. In this case, each DDR-DRAM has an associated external calibration reference.

A method for calibrating fast-switching output drivers outside the test laboratory in an operating environment is described in U.S. Pat. No. 6,330,194 B1 (Thomann et al.). In this case, a group of output drivers, for example the output drivers for a data bus in a DDR-DRAM, is aligned similarly to the result of an alignment for a further calibration driver, which is essentially similar to the data bus output driver. A signal level driven by the calibration driver is aligned with a reference voltage, with the load of the output driver formed by the bus configuration being simulated by switching the output of the calibration driver to a further data line routed parallel to the data bus, for example a data mask line (DM, data mask), during the alignment.

A drawback of known configurations with external calibration references in systems having a high storage density is the large space requirement for the calibration references as compared with the space requirement in corresponding semiconductor memory devices.

SUMMARY OF THE INVENTION

It is accordingly an object of the invention to provide a method for calibrating semiconductor devices using a common calibration reference and a calibration circuit that overcome the above-mentioned disadvantages of the prior art methods and devices of this general type, which reduces the space requirement for calibration references while providing essentially the same quality of calibration as compared with conventional methods. It is also an object of the present invention to provide an operating method for a plurality of calibratable semiconductor devices, and also a semiconductor device and a configuration of semiconductor devices that respectively permit such a calibration method and operating method.

The inventive method for calibrating interface devices of semiconductor devices using a calibration reference that is connected to at least one calibration connection on a semiconductor device thus contains the following steps:

1) providing a plurality of semiconductor devices which each have a calibration unit which is connected to the calibration connection via a calibration path which can be switched by a switching unit;
2) generating, in a first semiconductor device, an active calibration signal which connects the calibration unit to the calibration connection using the switching unit;
3) calibrating the interface devices in the first semiconductor device;
4) generating a passive calibration signal for isolating the calibration unit from the calibration connection using the switching unit; and
5) repeating respectively steps 2) to 4) for all further semiconductor devices.

In line with the inventive method, a plurality of semiconductor devices are accordingly assigned a single calibration reference. The semiconductor devices are aligned in succession, in each case individually, with just the calibration connection on the respective semiconductor device that is currently performing calibration being connected to the calibration unit by an internal switching unit, and the calibration connections on all other semiconductor devices being switched to high impedance internally.

High-density memory modules for use, by way of example, in PCs, workstations and servers, e.g. double data rate dual in line memory modules (DDR-DIMMs), are subject to narrow industrial standards for their dimensions. On the other hand, high-density storage media require as many memory chips as possible to be integrated on the memory module. Reducing the number of components to be integrated on the memory module advantageously results in significant simplification of component placement and the routing of interconnects on the memory module. In memory module configurations commonly used today, the invention advantageously dispenses with between 15 and 31 calibration references.

Since just one calibration reference is now disposed on a memory module at best, on the other hand, more precise implementation of the calibration reference, for example using temperature compensation, is also made possible in addition to simple implementation as a non-reactive resistor or voltage reference.

Calibration of individual or all semiconductor devices disposed to form a data bus system is possible by repeating the above steps 2 to 5 cyclically or as a reaction to an operating condition in the data bus system.

Preferably, the semiconductor devices provided have an instruction evaluation unit that is connected to control and address connections on the semiconductor device, which are provided for connecting a control and address bus. In this case, the calibration signal is generated in the instruction evaluation unit on the basis of a calibration instruction transmitted via the control and address bus. Performance of the calibration is then controlled by a system that is hierarchically superordinate to the semiconductor device.

For data bus systems in which the entire data bus is respectively connected to each of the semiconductor devices disposed to form the data bus system, a packet protocol is executed on the control and address bus and permits individual addressing of each individual semiconductor device. An example of such a data bus system is a fly-by bus.

By contrast, in the case of a hybrid data bus system, the data bus is much wider across the system than a data bus interface on the semiconductor devices.

In this case, sending the calibration instruction exclusively via the control and address bus is no longer sufficient. In line with the invention, this case is catered for by providing for the instruction evaluation units to be provided connected to at least one respective data connection from data connections provided for connecting data lines. The calibration signal is then generated on the basis of a data signal transmitted via the data lines.

On the part of a control chip (bus master) generating the calibrating instruction, it is necessary to ensure in this context that no more than one semiconductor device is performing the calibration procedure at any time. To this end, either signaling of completed calibration, for example in a mode register in the semiconductor device, or a maximum calibration period required for performing the calibration in a semiconductor device is awaited.

Typically, the inventive calibration method is provided for memory chips having a double data rate (DDR) interface. However, other applications, for example for aligning sensor arrays, are obvious to a person skilled in the art.

Memory chips with a DDR interface have output drivers for outputting data signals on the data lines and/or terminations for low-reflection termination of the data lines (DQ). As a result of the output drivers being aligned, narrower tolerance bands are obtained, e.g. for rise times and response times (slew rate) or else for the turn-on resistance and consequently higher data transmission rates.

In the case of an operating method for a plurality of semiconductor devices which are respectively connected to a common calibration reference and are disposed to form a data bus system having a control and address bus and an at least partially common data bus, the semiconductor devices are calibrated cyclically and/or on the basis of operating states of the data bus system. This is done by transmitting calibration instructions, in each case individually, to the semiconductor devices via the control and address bus (CA) indirectly or directly in succession and performing calibration in the respectively addressed semiconductor device.

If it is insufficient to send the calibration instruction exclusively via the control and address bus on account of the bus configuration, then the invention makes provision for the semiconductor device to be addressed for calibration on the basis of a further data signal transmitted via at least one data signal, data mask or data strobe signal line.

A semiconductor device which is suitable for the calibration method in accordance with the invention has a controllable switching unit in addition to control and address connections for connecting a control and address bus, data connections for connecting a data bus, a calibration connection for connecting a calibration reference, an instruction evaluation unit connected to the control and address connections, and a calibration unit connected to the calibration connection via a calibration path. The controllable switching unit can be used to open and to close the calibration path on the basis of calibration instructions transmitted via the control and address bus to the instruction evaluation unit.

In another embodiment of the inventive semiconductor device, the switching unit can be controlled on the basis of a data signal transmitted via at least one further data line.

Preferably, the semiconductor devices in this case are in the form of DRAMs with a DDR interface.

The advantages of the inventive calibration method and of the inventive semiconductor device relate, in particular, to computer-system memory modules that are fitted with a plurality of semiconductor devices in the form of DDR-DRAMs, in line with the invention. The dimensions and electrical interfaces of the memory modules are subject to industrial standards. In this context, the dimensions of the memory modules are normally minimized, in terms of a standard number of 16 or 32 semiconductor devices per memory module, such that additional components (such as the calibration references) can be placed and wired only with extraordinary difficulty. A memory module in line with the invention now has a single calibration reference instead of 16 or 32 calibration references on the basis of the standard, and this single calibration reference can also be matched quickly to various installation conditions.

Other features which are considered as characteristic for the invention are set forth in the appended claims.

Although the invention is illustrated and described herein as embodied in a method for calibrating semiconductor devices using a common calibration reference and a calibration circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a conventional semiconductor device;

FIG. 2 is a block diagram of a conventional configuration;

FIG. 5 is a block diagram of an inventive configuration based on a second exemplary embodiment.

DESCRIPTION OF THE PREFERRED EMBODIMENTS

Figure 3:
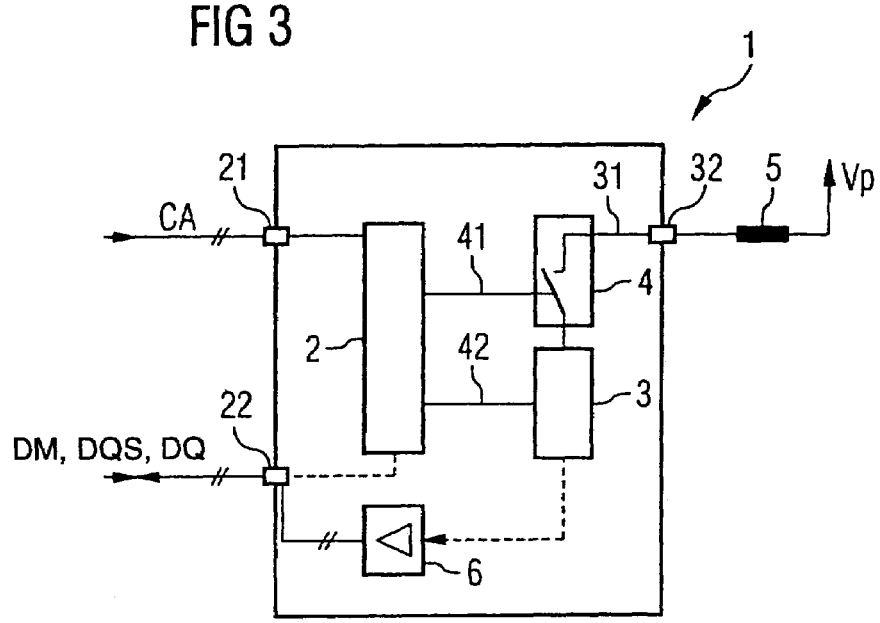
FIG. 3 is a block diagram a semiconductor device according to the invention.

Referring now to the figures of the drawing in detail and first, particularly, to FIG. 1 thereof, there is shown a DDR-DRAM 1' having output drivers 6 which can be calibrated using an external calibration reference 5 according to the prior art. To make matters simpler, the illustration in this case has been reduced to those components of the DDR-DRAM that are fundamental in this context. The DDR-DRAM 1' has control and address connections 21 for connecting a control and address bus CA, data connections 22 for connecting a data bus formed by data lines DQ, DM, DQS, and a calibration connection 32. The calibration reference 5 is connected to the calibration connection 32. A calibration unit 3 connected to the calibration connection 32 via a calibration path 31 uses the calibration reference 5 to align the output drivers 6.

FIG. 2 shows a plurality of the DDR-DRAMs 1' described with reference to FIG. 1, disposed to form a data bus system. In this case, each DDR-DRAM 1' has an associated external calibration reference 5.

The inventive semiconductor device 1 shown in FIG. 3 is a semiconductor memory device with a DDR interface. The semiconductor device has the calibration connection 32 that is connected to an auxiliary potential VP via the calibration reference 5. In addition, the control and address connections 21 for connecting the control and address bus CA are provided on the semiconductor device 1. A calibration instruction transmitted via the control and address bus CA is converted by an instruction evaluation unit 2 into a calibration signal that is routed to a switching unit 4 via a calibration signal path 41. The switching unit 4 is disposed in the calibration path 31. On the basis of the calibration signal, the calibration connection 32 is connected to the calibration unit 3 by the switching unit 4 or is without an internal connection.

The calibration unit 3 is either automatic or is activated by the instruction evaluation unit 2 via an auxiliary path 42 and aligns the output drivers 6 using an auxiliary voltage generated using the calibration reference 5.

To activate the calibration signal, it is also possible to assess data signals, applied to data connections 22, on a data bus DQ, on a data mask bus DM and/or data strobe signals DQS in the instruction evaluation unit 2.

Figure 4:
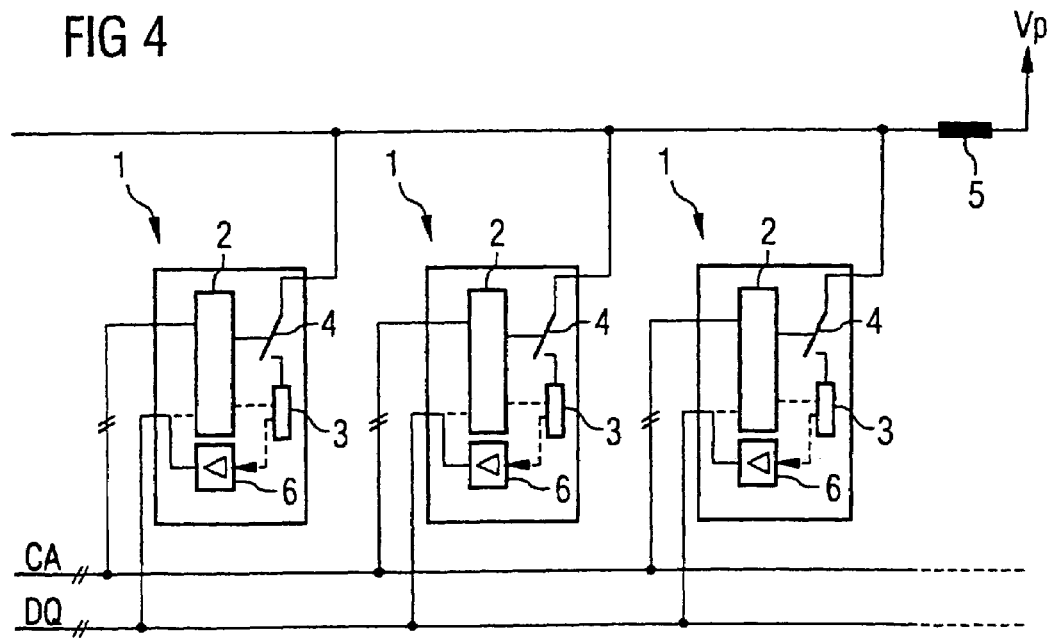
FIG. 4 is a block diagram of an inventive configuration based on a first exemplary embodiment.

In the configuration shown in FIG. 4, a plurality of the semiconductor devices 1 shown in FIG. 3 are combined to form a data bus system having a common control and address bus CA and a common data bus DQ. Each semiconductor device 1 is connected to the auxiliary potential VP via a common calibration reference 5. Each of the semiconductor devices 1 can be individually addressed via the control and address bus CA.

In line with the inventive calibration method, the switching units 4 in all the semiconductor devices 1 are initially open and hence the calibration connections 32 in the semiconductor devices 1 are switched to high impedance. A calibration cycle starts to transmit a calibration instruction to a first semiconductor device 1 via the control and address bus CA. In the addressed first semiconductor device 1, the calibration instruction initiates an active calibration signal on the calibration signal path 41. The switching unit 4 in the addressed semiconductor device 1 is closed and the calibration unit 3 of the addressed semiconductor device 1 is connected to the calibration reference. By way of example, the output drivers or the terminations of the semiconductor device 1 are then calibrated.

After a calibration period has elapsed, the switching unit 4 is opened. The switching unit 4 is opened under time control when a timer has run out, using an output signal from the calibration unit 3 (calibration complete) or by a control instruction transmitted via the control and address bus. If it is certain that the calibration connection 32 on the first semiconductor device 1 has been switched to high impedance, that is to say either after the calibration period has elapsed or as a result of the calibration state being read from a mode register in the instruction evaluation unit, a further calibration instruction is sent to a second semiconductor device.

In a fly-by data bus system as shown in FIG. 4, data bus interfaces in the semiconductor devices 1 each have the same width, that is to say an identical number of data signal lines, and can always be addressed individually. To send the calibration instruction explicitly, the control and address bus CA is thus sufficient in each case.

In hybrid data bus systems, in which just some of the data signal lines are routed to the semiconductor devices 1 in each case, the control and address bus CA respectively addresses a plurality of semiconductor devices 1 simultaneously. Thus, by way of example, the DDR bus concept provides a data bus width of 64 bits, while the number of data bus connections on the semiconductor devices 1 provided for the DDR bus concept is limited to 16 bits. In such a hybrid data bus system, four semiconductor memory devices 1 are addressed simultaneously when a data address is accessed.

To assign a calibration instruction explicitly to one of the semiconductor memory devices 1, in addition to the addressing in the control and address bus CA, further information is used from the data bus DQ, the data mask bus DM or the data strobe signals DQS. In the exemplary embodiment shown in FIG. 5, this purpose is served by providing, by way of example, the data signal lines DQ[0] for the bottom semiconductor device, DQ[16] for the one disposed above that, DQ[32] for the next and DQ[48] for the top semiconductor device.

We claim:

1. A method for calibrating interface devices, which comprises the steps of:
   a) providing a plurality of semiconductor devices each having the interface devices, a calibration unit connected to the interface devices, a calibration connection, a calibration path connected to the calibration connection, and a switching unit disposed in the calibration path for controlling and switching the calibration path;
   b) generating, in a first semiconductor device of the semiconductor devices, an active calibration signal connecting the calibration unit to the calibration connection using the switching unit;
   c) calibrating the interface devices in the first semiconductor device;
   d) generating a passive calibration signal isolating the calibration unit from the calibration connection using the switching unit; and
   e) repeating steps b), c) and d) for all further semiconductor devices of the semiconductor devices.

2. The calibration method according to claim 1, wherein the repeating step comprises repeating cyclically the steps b) through e).

3. The calibration method according to claim 1, which further comprises:
   providing each of the semiconductor devices with an instruction evaluation unit being connected to control and address connections on a respective semiconductor device, the control and address connections being provided for connecting to a control and address bus; and
   generating the active calibration signal in the instruction evaluation unit on a basis of a calibration instruction transmitted via the control and address bus.

4. The calibration method according to claim 3, which further comprises:
   connecting the instruction evaluation unit to at least one respective data connection for connecting to a data line; and
   generating the active calibration signal on a basis of a data signal transmitted via the data line.

5. The calibration method according to claim 4, which further comprises forming the semiconductor devices as memory chips having a double data rate interface.

6. The calibration method according to claim 1, which further comprises using the interface devices as output drivers for outputting data signals on data signal lines and/or terminations for low-reflection termination of the data signal lines.

7. The calibration method according to claim 1, wherein the repeating step comprises repeating the steps b) through e) as a reaction to an operating condition in one of the semiconductor devices.

8. A method for operating a plurality of semiconductor devices each connected to a common calibration reference and disposed to form a data bus system having a control and address bus and an at least partially common data bus, which comprises the steps of:
   transmitting, in each case individually, calibration instructions to the semiconductor devices over the control and address bus in indirect or direct succession cyclically and/or on a basis of operating states of the data bus system;
   connecting a calibration connection to a calibration unit in a respectively addressed semiconductor device;
   calibrating interface devices in the respectively addressed semiconductor device using the calibration unit; and
   switching the calibration connection to a high impedance state after completing a calibration process.

9. The operating method according to claim 8, which further comprises addressing a semiconductor device for calibration on a basis of a data signal transmitted via at least one further data line.

10. A semiconductor device, comprising:
    a device for performing the calibration in according to claim 1;
    control and address connections for connecting to a control and address bus;
    data connections for connecting to a data bus;
    a calibration connection for connecting to a calibration reference;
    an instruction evaluation unit connected to said control and address connections;
    a calibration path;
    a calibration unit connected to said calibration connection through said calibration path;
    a calibration signal path; and
    a switching unit integrated in said calibration path for opening and closing said calibration path, said switching unit coupled to said instruction evaluation unit through said calibration signal path, said instruction evaluation unit controlling said switching unit on a basis of calibration instructions transmitted via the control and address bus.

11. The semiconductor device according to claim 10, wherein said switching unit is controlled on a basis of a data signal transmitted via at least one data line.

12. The semiconductor device according to claim 10, wherein the semiconductor device is a memory chip and has a double data rate interface.

13. The semiconductor device according to claim 10, further comprising output drivers which can be calibrated using the calibration reference for outputting data signals on data signal lines and/or calibratable terminations for terminating the data signal lines.

14. A memory module for computer systems, comprising:
    a plurality of semiconductor devices for performing the calibration according to claim 1, each of said semiconductor devices containing:
    control and address connections for connecting to a control and address bus;
    data connections for connecting to a data bus; a calibration connection for connecting to a calibration reference;
    an instruction evaluation unit connected to said control and address connections;
    a calibration path;
    a calibration unit connected to said calibration connection through said calibration path;
    a calibration signal path; and
    a switching unit integrated in said calibration path for opening and closing said calibration path, said switching unit coupled to said instruction evaluation unit through said calibration signal path, said instruction evaluation unit controlling said switching unit on a basis of calibration instructions transmitted via the control and address bus.

* * * * *